US009610550B2

(12) United States Patent
Alvarez, Jr. et al.

(10) Patent No.: US 9,610,550 B2
(45) Date of Patent: Apr. 4, 2017

(54) METHOD OF DELIVERING A PROCESS GAS FROM A MULTI-COMPONENT SOLUTION

(71) Applicant: RASIRC, Inc., San Diego, CA (US)

(72) Inventors: Daniel Alvarez, Jr., Oceanside, CA (US); Jeffrey Spiegelman, San Diego, CA (US); Russell J. Holmes, San Diego, CA (US); Edward Heinlein, San Diego, CA (US); Zohreh Shamsi, San Diego, CA (US)

(73) Assignee: Rasirc, Inc., San Diego, CA (US)

( * ) Notice: Subject to any disclaimer, the term of this patent is extended or adjusted under 35 U.S.C. 154(b) by 362 days.

(21) Appl. No.: 14/387,872

(22) PCT Filed: Mar. 14, 2013

(86) PCT No.: PCT/US2013/031519
§ 371 (c)(1),
(2) Date: Sep. 25, 2014

(87) PCT Pub. No.: WO2013/148262
PCT Pub. Date: Oct. 3, 2013

(65) Prior Publication Data
US 2015/0068611 A1    Mar. 12, 2015

Related U.S. Application Data

(60) Provisional application No. 61/617,011, filed on Mar. 28, 2012.

(51) Int. Cl.
*B01D 53/22* (2006.01)
*B01F 3/02* (2006.01)
(Continued)

(52) U.S. Cl.
CPC ............. *B01F 3/02* (2013.01); *B01D 53/228* (2013.01); *B01D 61/246* (2013.01);
(Continued)

(58) Field of Classification Search
CPC .. B01D 61/362; B01D 53/228; B01D 61/246; B01D 63/02; B01D 2258/0216;
(Continued)

(56) References Cited

U.S. PATENT DOCUMENTS 3,750,735 A * 8/1973 Chiang ................ B01D 61/362
159/49
4,806,245 A * 2/1989 Boddeker ............ B01D 61/362
210/195.2
(Continued)

FOREIGN PATENT DOCUMENTS

WO    WO2012/024131        2/2012
WO    WO2012024131 A2     2/2012

*Primary Examiner* — Anthony Shumate
(74) *Attorney, Agent, or Firm* — Pierce Atwood LLP; Kevin M. Farrell; Daniel A. Lev

(57) ABSTRACT

A method and chemical delivery system are provided. The method includes providing a vapor phase of a multi-component liquid source. The method further includes contacting a pre-loaded carrier gas with the vapor phase, wherein the pre-loaded carrier gas includes a carrier gas and at least one component of the multi-component liquid source and delivering a gas stream comprising at least one component of the liquid source to a critical process or application, wherein the amount of the component in the carrier gas is sufficient to keep the ratio of components in the multi-component liquid source relatively constant. The chemical delivery system includes a multi-component liquid source having a vapor phase. The system further includes a pre-loaded carrier gas source that is in fluid contact with the vapor phase, wherein the pre-loaded carrier gas includes a carrier gas and at least one component of the liquid source and an apparatus for delivering a gas stream including at least one component of the liquid source, wherein the amount of the component in the pre-loaded carrier gas is
(Continued)

sufficient to keep the ratio of components in the multi-component liquid source relatively constant.

32 Claims, 11 Drawing Sheets

(51) Int. Cl.
    *C23C 16/448*     (2006.01)
    *B01D 61/24*     (2006.01)
    *B01D 63/02*     (2006.01)

(52) U.S. Cl.
    CPC .......... *C23C 16/4481* (2013.01); *B01D 63/02* (2013.01); *B01D 2258/0216* (2013.01); *Y10T 137/0391* (2015.04); *Y10T 137/2931* (2015.04)

(58) Field of Classification Search
    CPC ....... B01D 61/36; B01F 3/02; C23C 16/4481; Y10T 137/0391; Y10T 137/2931
    See application file for complete search history.

(56) References Cited

U.S. PATENT DOCUMENTS

| | | | | |
|---|---|---|---|---|
| 5,013,436 A * | 5/1991 | Lee | ...................... | B01D 61/362 210/321.8 |
| 5,649,996 A * | 7/1997 | Soffer | .................... | B01D 53/22 62/655 |
| 5,910,448 A * | 6/1999 | Atwater | ................. | B01D 53/22 422/82.02 |
| 5,928,409 A * | 7/1999 | Sirkar | .................... | B01D 53/22 95/45 |
| 9,410,191 B2 * | 8/2016 | Alvarez, Jr. | .......... | C12Q 1/6848 |
| 2002/0192938 A1 * | 12/2002 | Wada | .................. | H01L 21/2855 438/618 |
| 2003/0105356 A1 * | 6/2003 | Schiffer | ............... | B01D 61/362 564/264 |
| 2004/0079491 A1 * | 4/2004 | Harris | ..................... | C02F 1/047 159/16.1 |
| 2005/0193758 A1 * | 9/2005 | Wells | ...................... | F25B 15/02 62/324.2 |
| 2006/0021615 A1 | 2/2006 | Kertzman | | |
| 2007/0187320 A1 * | 8/2007 | Mabuchi | ................ | B01D 63/02 210/500.41 |
| 2007/0199891 A1 * | 8/2007 | Mabuchi | ............ | B01D 67/0011 210/500.23 |
| 2008/0237057 A1 * | 10/2008 | Li | ......................... | B01D 61/362 205/349 |
| 2009/0014901 A1 | 1/2009 | Spiegelman | | |
| 2009/0145831 A1 * | 6/2009 | Manabe | ................ | B01D 63/082 210/232 |
| 2009/0188863 A1 * | 7/2009 | Knapp | ................. | B01D 61/362 210/640 |
| 2010/0024816 A1 | 2/2010 | Weinstein et al. | | |
| 2010/0034697 A1 * | 2/2010 | Weinberger | ............... | A61L 2/20 422/28 |
| 2010/0117246 A1 | 5/2010 | Sarigiannis et al. | | |
| 2010/0275629 A1 * | 11/2010 | Erickson | ............... | F24F 3/1417 62/271 |
| 2011/0076192 A1 * | 3/2011 | Robitaille | ............... | A61L 2/202 422/29 |
| 2013/0199220 A1 * | 8/2013 | Ma | ....................... | B01D 53/263 62/91 |
| 2014/0014138 A1 | 1/2014 | Spiegelman et al. | | |
| 2015/0190736 A1 * | 7/2015 | Alvarez, Jr. | .......... | C01B 15/017 95/46 |
| 2015/0329901 A1 * | 11/2015 | Alvarez, Jr. | ......... | C12Q 1/6848 422/28 |
| 2016/0051928 A1 * | 2/2016 | Spiegelman | ............. | A61L 2/00 137/1 |

* cited by examiner

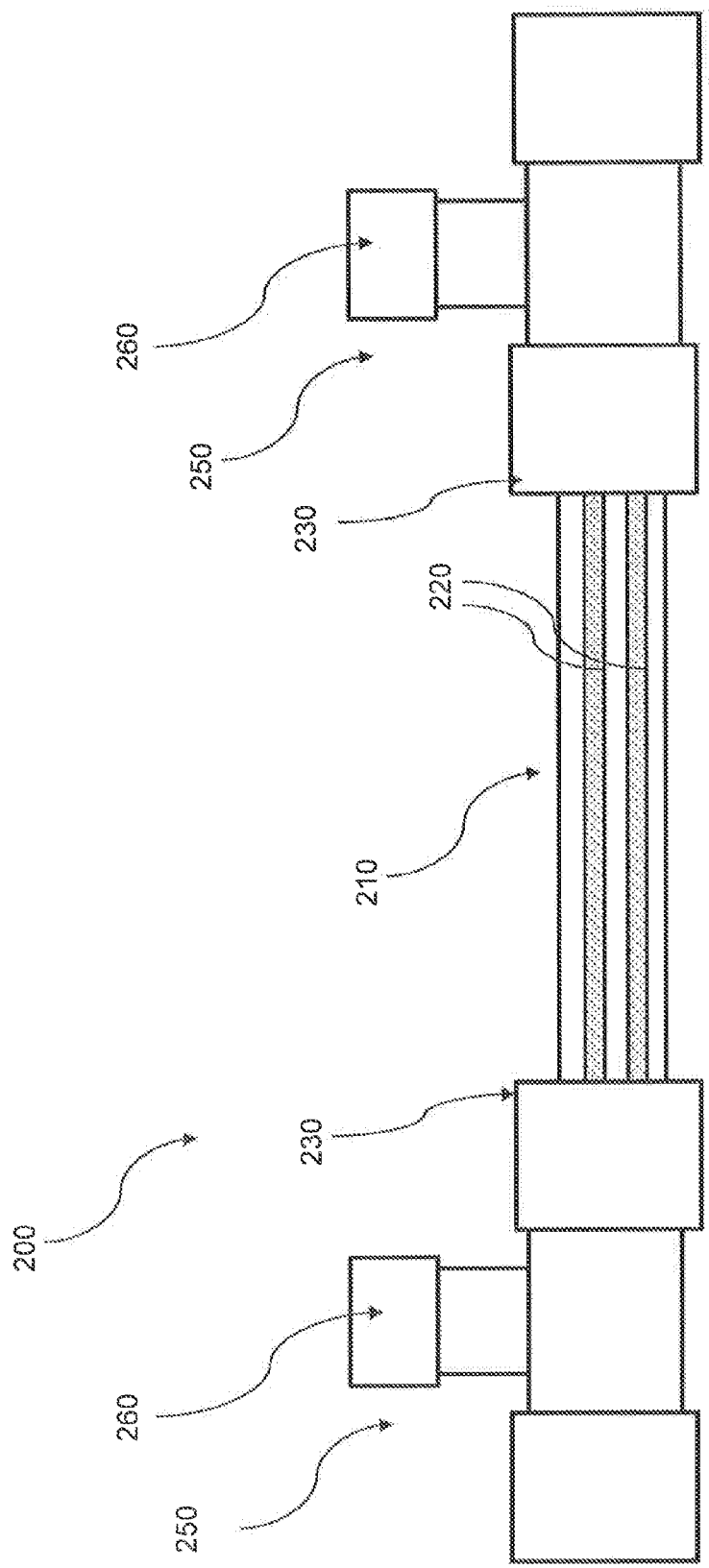

METHOD OF DELIVERING A PROCESS GAS FROM A MULTI-COMPONENT SOLUTION

TECHNICAL FIELD

Methods and devices for the vapor phase delivery of high purity process gases, particularly low volatility process gases obtained from a liquid source, in micro-electronics and other critical process applications.

BACKGROUND

Various process gases may be used in the manufacturing and processing of micro-electronics. In addition, a variety of chemicals may be used in other environments demanding high purity gases, e.g., critical processes, including without limitation microelectronics applications, wafer cleaning, wafer bonding, photolithography mask cleaning, atomic layer deposition, chemical vapor deposition, flat panel displays, disinfection of surfaces contaminated with bacteria, viruses and other biological agents, industrial parts cleaning, pharmaceutical manufacturing, production of nano-materials, power generation and control devices, fuel cells, power transmission devices, and other applications in which process control and purity are critical considerations. In those processes, it is necessary to deliver very specific amounts of certain process gases under tightly controlled temperature, pressure and flow rate conditions.

There are numerous process gases used in micro-electronics applications and other critical processes. One advantage of using process gases in micro-electronics applications and other critical processes, as opposed to liquid-based approaches, is that gases are able to access high aspect ratio features on a surface. For example, according to the International Technology Roadmap for Semiconductors (ITRS), current semiconductor processes should be compatible with a half-pitch as small as 20-22 nm. The next technology node for semiconductors is expected to have a half-pitch of 14-16 nm, and the FIRS calls for <10 nm half-pitch in the near future. At these dimensions, liquid-based chemical processing is not feasible, because the surface tension of the process liquid prevents it from accessing the bottom of deep holes or channels and the corners of high aspect ratio features. Therefore, process gases have been used in some instances to overcome certain limitations of liquid-based processes, because gases do not suffer from the same surface tension limitations.

Ozone is a gas that is typically used to clean the surface of semiconductors (e.g., photoresist stripping) and as an oxidizing agent (e.g., forming oxide or hydroxide layers). Plasma-based processes have also been employed to overcome certain limitations of liquid-based processes. However, ozone- and plasma-based processes present their own set of limitations, including, inter alia, cost of operation, insufficient process controls, undesired side reactions, and inefficient cleaning. More recently, hydrogen peroxide has been explored as a replacement for ozone in certain applications. However, for several reasons, hydrogen peroxide has been of limited utility. Highly concentrated hydrogen peroxide solutions present serious safety and handling concerns and obtaining high concentrations of hydrogen peroxide in the gas phase has not been possible using existing technology. Similar concerns have limited the feasibility of using other potentially beneficial process gases, such as hydrazine.

For additional reasons, gas phase delivery of process chemicals is preferred to liquid phase delivery. For applications requiring low mass flow for process chemicals, liquid delivery of process chemicals is not accurate or clean enough. Gaseous delivery would be desired from a standpoint of ease of delivery, accuracy and purity. Low vapor liquids, such as water and hydrogen peroxide, are generally not available in the gas phase and, thus, the gas phase must be created in situ from the corresponding liquid. One approach is to vaporize the process chemical component directly at or near the point of use. Vaporizing liquids provides a process that leaves heavy contaminants behind, thus purifying the process chemical. There is an approximately 1000-fold increase in volume when changing from the liquid to the gas phase. Gas flow devices are better attuned to precise control than liquid delivery devices. Additionally, micro-electronics applications and other critical processes typically have extensive gas handling systems that make gaseous delivery considerably easier than liquid delivery. However, for safety, handling, stability, and/or purity reasons, many process gases are not amenable to direct vaporization from their pure liquid phase.

Gas phase delivery of low volatility compounds presents a particularly unique set of problems. One approach is to provide a multi-component liquid source wherein the process chemical is mixed with a more volatile solvent, such as water or an organic solvent (e.g., isopropanol). This is particularly suitable for aqueous hydrogen peroxide or hydrazine solutions, as high concentrations of hydrogen peroxide or hydrazine present an explosion hazard. However, when a multi-component solution is the liquid source to be delivered (e.g., hydrogen peroxide and water), Raoult's Law for multi-component solutions becomes relevant, According to Raoult's Law, for an idealized two-component solution, the vapor pressure of the solution is equal to the weighted sum of the vapor pressures for a pure solution of each component, where the weights are the mole fractions of each component:

$$P_{tot} = P_a x_a + P_b x_b$$

In the above equation, $P_{tot}$ is the total vapor pressure of the two-component solution, $P_a$ is the vapor pressure of a pure solution of component A, $x_a$ is the mole fraction of component A in the two-component solution, $P_b$ is the vapor pressure of a pure solution of component B, and $x_b$ is the mole fraction of component B in the two-component solution. Therefore, the relative mole fraction of each component is different in the liquid phase than it is in the vapor phase above the liquid. Specifically, the more volatile component (i.e., the component with the higher vapor pressure) has a higher relative mole fraction in the gas phase than it has in the liquid phase. In addition, because the gas phase of a typical gas delivery device, such as a bubbler, is continuously being swept away by a carrier gas, the composition of the two-component liquid solution, and hence the gaseous head space above the liquid, is dynamic. Unless the more volatile component is continuously replenished, the mole fraction of the less volatile component will increase in the liquid over time.

Thus, according to Raoult's Law, if a vacuum is pulled on the head space of a multi-component liquid solution or if a traditional bubbler or vaporizer is used to deliver the solution in the gas phase, the more volatile component of the liquid solution will be preferentially removed from the solution as compared to the less volatile component. This limits the concentration of the less volatile component that can be delivered in the gas phase. For instance, if a carrier gas is bubbled through a 30% hydrogen peroxide/water solution, only about 295 ppm of hydrogen peroxide will be delivered, the remainder being all water vapor (about 20,000 ppm) and the carrier gas. For vapor pressure and vapor composition studies of various hydrogen peroxide solutions, see *Hydrogen Peroxide*, Walter C. Schumb, Charles N. Satterfield and Ralph L. Wentworth, Reinhold Publishing Corporation, 1955, New York, available at http://hdl.handle-.net/2027/mdp.39015003708784.

The differential delivery rate that results when a multi-component liquid solution is used as the source of process gases prevents repeatable process control. Process recipes cannot be written around continuously changing mixtures. Controls for measuring a continuously changing ratio of the components of the liquid source are not readily available, and if available, they are costly and difficult to integrate into the process. In addition, certain solutions become hazardous if the relative ratio of the components of the liquid source changes. For example, hydrogen peroxide in water becomes explosive at concentrations over about 75%; and thus, delivering hydrogen peroxide by bubbling a dry gas through an aqueous hydrogen peroxide solution, or evacuating the head space above such solution, can take a safe solution (e.g., 30% $H_2O_2/H_2O$) and convert it to a hazardous material that is over 75% hydrogen peroxide. Therefore, currently available delivery devices and methods are insufficient for consistently, precisely, and safely delivering controlled quantities of process gases in many micro-electronics applications and other critical processes.

For a variety of applications and processes, it would be advantageous to use gas phase processes based on chemicals that are more typically available as liquid solutions, e.g., organic and inorganic solvents, inorganic and organic acids and bases, and oxidizing agents and reducing agents. Example of such chemicals include, without limitation, hydrogen peroxide, hydrazine, or isopropanol. But the gas phase use of those chemicals has been limited by, inter alia, Raoult's Law, as well as safety, handling, and purity concerns. Therefore, a technique is needed to overcome these limitations and, specifically, to allow the use of gaseous process chemicals obtained from a multi-component liquid source.

SUMMARY OF CERTAIN EMBODIMENTS

According to Raoult's Law, when the vapor phase of a liquid solution is continuously swept away by a carrier gas, the more volatile component will evaporate more quickly than the less volatile component, resulting in a dynamic concentration of the components in the liquid solution. If evaporation of the more volatile component continues, the solution will become more concentrated for the less volatile component, and in some cases (e.g., aqueous hydrogen peroxide solutions), this may take a stable solution and convert it to a highly concentrated hazardous material. To overcome these limitations, methods, systems, and devices are provided wherein a pre-loaded carrier gas is in fluid contact with the vapor phase of a multi-component liquid source. The pre-loaded carrier gas comprises an amount of a high volatility component of the liquid source. Using the methods, systems, and devices provided herein the concentration of the high volatility component of the liquid source is substantially maintained over time.

The methods, systems, and devices provided herein are particularly useful in micro-electronics applications and other critical processes. The methods, systems, and devices enable the safe and controlled transfer and/or purification of low volatility compounds (e.g., hydrogen peroxide or hydrazine) from multi-component liquid solutions (e.g., aqueous hydrogen peroxide or aqueous hydrazine) into a vapor in a pre-loaded carrier gas optionally employing a substantially gas-impermeable membrane. In certain embodiments, the low volatility compound is hydrogen peroxide or hydrazine. Generally, the methods comprise (a) providing a multi-component liquid source having a vapor phase optionally separated from the liquid source by a membrane; (b) contacting a pre-loaded carrier gas with the vapor phase, wherein the pre-loaded carrier gas comprises a carrier gas and at least one component of the liquid source; and (c) delivering a gas stream comprising the low volatility compound to a critical process or application.

Systems and devices for delivering a low volatility compound as a gas using the methods described herein are also provided. Generally, the systems and devices comprise (a) a multi-component liquid source having a vapor phase optionally separated from the liquid source by a membrane; (b) a pre-loaded carrier gas source that is in fluid contact with the vapor phase, wherein the pre-loaded carrier gas comprises a carrier gas and at least one component of the liquid source; and (c) an apparatus for delivering a gas stream comprising at least one component of the liquid source. In a preferred embodiment, the apparatus for delivering a process gas containing gas stream is an outlet of a head space, which contains the vapor phase, connected directly or indirectly to a micro-electronics application or other critical process system, allowing the process gas containing gas stream to flow from the head space to the application or process in which it will be used. Methods for delivering a process gas containing gas stream using the systems and devices described herein are also provided.

By adjusting the operating conditions of the methods, systems, and devices provided herein, i.e., the temperature and pressure of the pre-loaded carrier gas, flow rate of the carrier gas, the concentration of the liquid source, and the temperature and pressure of the liquid source, the low volatility compound (e.g., hydrogen peroxide or hydrazine) can be precisely and safely delivered as a process gas.

In certain embodiments, the pre-loaded carrier gas may be obtained, stored, and used directly in methods, system, and devices provided herein. In certain other embodiments, the pre-loaded carrier gas may be generated at the point of use from a carrier gas and at least one component of the liquid source, e.g., by a device for adding such component(s) to a carrier gas. Exemplary pre-loaded carrier gases comprise a carrier gas and water, alcohols, ketones, ethers, organic acids, inorganic acids, organic solvents, or inorganic solvents. A preferred pre-loaded carrier gas is humidified nitrogen, which may be generated by contacting a nitrogen carrier gas with a humidifier device, e.g., a membrane contactor or a RainMaker™ humidification device available from RASIRC, Inc. of San Diego, Calif.

The amount of the high volatility component in the pre-loaded carrier gas is typically sufficient to maintain the correct ratio of the liquid source. As an approximation, the following equation shows the partial pressure of the pre-loaded component for ideal solutions that follow Raoult's Law:

$$P(\text{preload}_a) = P'_a - (x_a/x_b)P'_b$$

$$P(\text{preload}_a) = P_a x_a - P_b$$

$$P(\text{preload}_a) = x_a(P_a - P_b)$$

Wherein, $P(\text{preload}_a)$ is the partial pressure of the pre-loaded component (A) in the pre-loaded carrier, $P'_a$ is the partial pressure of high volatility component A in the vapor phase, P'$_b$ is the partial pressure of less volatile component B in the vapor phase, P$_a$ is the vapor pressure of a pure solution of component A, P$_b$ is the vapor pressure of a pure solution of component B, and x$_a$ and x$_b$ are the relative mole fractions of components A and B in the liquid source. Typically, the amount of the pre-loaded component would need to be determined experimentally, because Raoult's Law is an idealized approximation and most solutions are non-ideal. But the approximation provided this equations typically provides a useful starting point.

In certain embodiments, particularly when the liquid source is enclosed in a compartment, a vapor phase of the liquid source may be described as a "head space." In certain embodiments, the head space may be a space located adjacent to the liquid source and may be separated from the liquid source by a substantially gas-impermeable membrane. In those embodiments with a liquid source and a head space separated by a substantially gas-impermeable membrane, the head space may be located above, below, or on any side of the liquid source, or the head space may surround or be surrounded by the liquid source. For example, the head space may be the space inside a substantially gas-impermeable tube (e.g., a membrane lumen) running through the liquid source or the liquid source may be located inside a substantially gas-impermeable tube (e.g., a membrane lumen) with the head space surrounding the outside of the tube.

Exemplary multi-component solutions are solutions containing organic or inorganic solvents; water- or alcohol-containing solutions of inorganic acids, inorganic bases, or oxidizing or reducing agents; aqueous H$_2$O$_2$ solutions; water-alcohol solutions, such as water-isopropanol solutions; H$_2$O$_2$/H$_2$O/isopropanol solutions; and aqueous hydrazine solutions. As discussed above, the composition of this solution may be dynamic and, according to Raoult's Law, the concentration of the low volatility compound may increase over time if the more volatile component is not replenished. In a preferred embodiment, the liquid source comprises an aqueous H$_2$O$_2$ solution, particularly a 30% H$_2$O$_2$ aqueous solution. In another preferred embodiment, the liquid source comprises an aqueous hydrazine solution, particularly a 64% hydrazine aqueous solution. Although aqueous solutions are commonly used liquid sources in the methods, systems, and devices disclosed herein, the selection of applicable multi-component liquid solutions is not so limited. Selection of an appropriate multi-component liquid solution will be determined by the requirements of a particular application or process.

In certain embodiments, the methods, systems, and devices provided herein may employ a variety of membranes. The membrane is preferably permeable to a low volatility compound (e.g., hydrogen peroxide or hydrazine), particularly a substantially gas-impermeable membrane, e.g., a perfluorinated ion-exchange membrane, such as a NAFION® membrane. In this manner, the low volatility compound passes through the membrane and is introduced into the gas stream on the other side of the membrane, thus providing a gas stream comprising the low volatility compound that can be used in various micro-electronics applications and other critical processes. In a preferred embodiment, the membrane is a substantially gas-impermeable membrane with a high permeability for a low volatility compound (e.g., hydrogen peroxide or hydrazine) and to a lesser extent is also permeable to a relatively more volatile solvent (e.g., water). Thus, water may move across the membrane from the liquid source to the carrier gas, while concomitantly the water from the pre-loaded carrier gas may move across the membrane to the liquid source. The membrane may also act as a permeable barrier separating a concentration gradient between the liquid source and the pre-loaded carrier gas. In certain embodiments, such selectively permeable membranes may amplify the concentration of a low volatility compound in the resultant gas stream, i.e., the concentration of the low volatility compound (e.g., hydrogen peroxide or hydrazine) exceeds the concentration that would be obtained directly from the vapor phase of the liquid source in the absence of the membrane.

The methods, systems, and devices provided herein may further comprise removing one or more components from the process gas containing gas stream to produce a purified process gas containing gas stream, e.g., using a device that selectively or non-selectively removes components from the gas stream. Preferred devices would be devices that substantially remove a non-reactive process gas from the process gas containing gas stream, while the amount of a reactive process gas in the process gas containing gas stream is relatively unaffected. For example, according to an aspect of the present invention, the devices may further comprise a dehumidifier positioned downstream of the head space. By adding a dehumidifier to such a device, water can be removed from a process gas containing stream. For example, if a pre-humidified carrier gas is contacted with the vapor phase of an aqueous hydrogen peroxide solution to provide a carrier gas containing hydrogen peroxide and water, the water from that hydrogen peroxide containing gas stream may be removed therefrom by a dehumidifier downstream of the head space to provide a substantially dry hydrogen peroxide containing gas stream. Particularly preferred devices for removing water or other components from a process gas containing gas stream are membrane contactors. But molecular sieves, activated charcoal, and other adsorbents may be equally applicable if they have the desired characteristics to meet the application or process requirements. A preferred characteristic of the gas removal device is the ability to remove certain component(s) in a relatively selective manner while allowing the remaining component(s) to remain in the process gas containing gas stream relatively unaffected.

The devices provided herein may further comprise various components for containing and controlling the flow of the gases and liquids used therein. For example, the devices may further comprise mass flow controllers, valves, check valves, pressure gauges, regulators, rotameters, and pumps. The devices provided herein may further comprise various heaters, thermocouples, and temperature controllers to control the temperature of various components of the devices and steps of the methods.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the embodiments and claims.

It is to be understood that both the foregoing general description and the following detailed description are exemplary and explanatory only and are not restrictive of the invention.

The accompanying drawings, which are incorporated in and constitute a part of this specification, illustrate several embodiments of the invention and, together with the description, serve to explain the principles of the invention.

BRIEF DESCRIPTION OF THE DRAWINGS

FIG. 2B is a diagram illustrating a membrane contactor assembly useful in certain embodiments of the present invention, such as a hydrogen peroxide delivery assembly (HPDA).

DETAILED DESCRIPTION OF CERTAIN EMBODIMENTS

Figure 1:
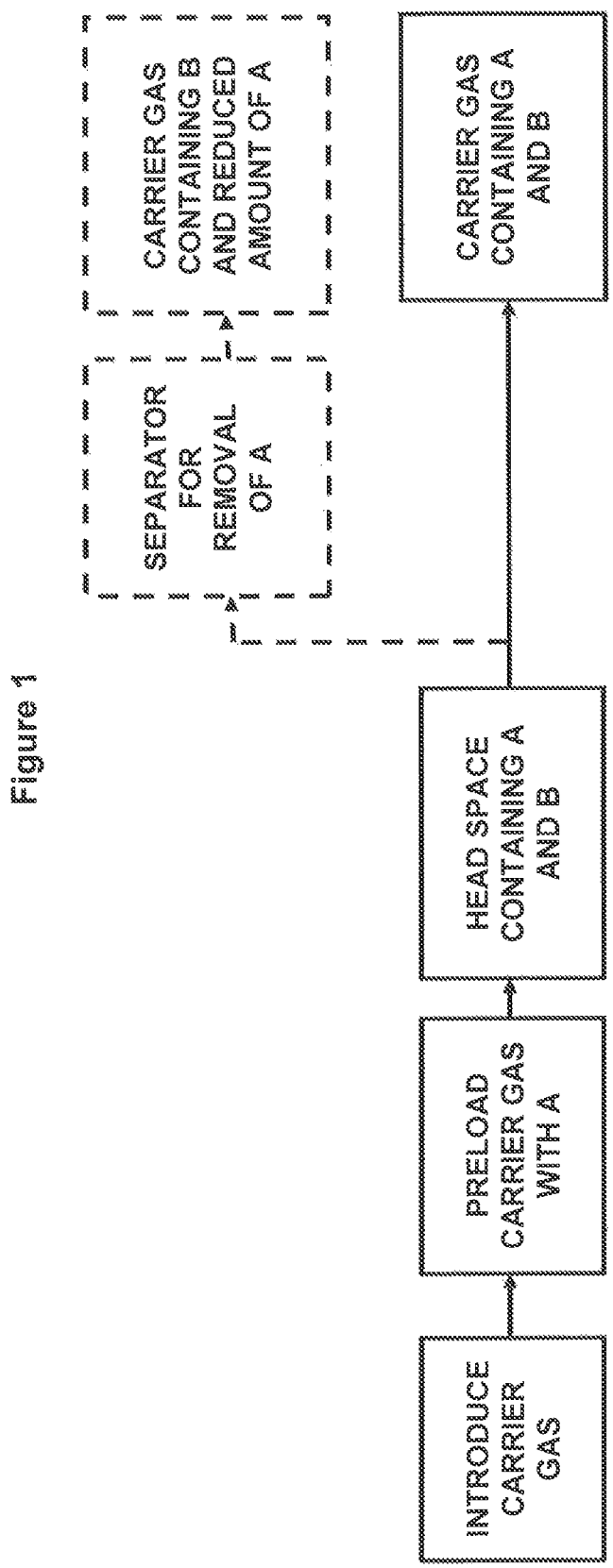
FIG. 1 is a process flow diagram illustrating certain embodiments of the present invention.

The term "process gas" as used herein is a broad term, and is to be given its ordinary and customary meaning to a person of ordinary skill in the art (and is not to be limited to a special or customized meaning), and refers without limitation to a gas that is used in an application or process, e.g., a step in the manufacturing or processing of micro-electronics and in other critical processes. Exemplary process gases are inorganic acids, organic acids, inorganic bases, organic bases, and inorganic and organic solvents. A preferred process gas is hydrogen peroxide.

The term "reactive process gas" as used herein is a broad term, and is to be given its ordinary and customary meaning to a person of ordinary skill in the art (and is not to be limited to a special or customized meaning), and refers without limitation to a process gas that chemically reacts in the particular application or process in which the gas is employed, e.g., by reacting with a surface, a liquid process chemical, or another process gas.

The term "non-reactive process gas" as used herein is a broad term, and is to be given its ordinary and customary meaning to a person of ordinary skill in the art (and is not to be limited to a special or customized meaning), and refers without limitation to a process gas that does not chemically react in the particular application or process in which the gas is employed, but the properties of the "non-reactive process gas" provide it with utility in the particular application or process.

The term "carrier gas" as used herein is a broad term, and is to be given its ordinary and customary meaning to a person of ordinary skill in the art (and is not to be limited to a special or customized meaning), and refers without limitation to a gas that is used to carry another gas through a process train, which is typically a train of piping. Exemplary carrier gases are nitrogen, argon, hydrogen, oxygen, $CO_2$, clean dry air, helium, or other gases that are stable at room temperature and atmospheric pressure.

The term "pre-loaded carrier gas" means a carrier gas containing an amount of one or more component(s) of a liquid source.

The term "inert gas" as used herein is a broad term, and is to be given its ordinary and customary meaning to a person of ordinary skill in the art (and is not to be limited to a special or customized meaning), and includes without limitation a gas that is not permeable to the membrane as described herein.

The term "liquid source" as used herein is a broad term, and is to be given its ordinary and customary meaning to a person of ordinary skill in the art (and is not to be limited to a special or customized meaning), and refers without limitation to a liquid solution that provides the source of a gas used in an application or process, specifically a process gas.

The term "head space" as used herein is a broad term, and is to be given its ordinary and customary meaning to a person of ordinary skill in the art (and is not to be limited to a special or customized meaning), and refers without limitation to a volume of gas in fluid contact with a liquid source that provides at least a portion of the gas contained in the head space. There may be a permeable or selectively permeable barrier separating the head space from the liquid source.

The term "substantially gas-impermeable membrane" as used herein is a broad term, and is to be given its ordinary and customary meaning to a person of ordinary skill in the art (and is not to be limited to a special or customized meaning), and refers without limitation to a membrane that is relatively permeable to other components that may be present in a gaseous or liquid phase, e.g., water or hydrogen peroxide, but relatively impermeable to other gases such as, but not limited to, hydrogen, nitrogen, oxygen, carbon monoxide, carbon dioxide, hydrogen sulfide, hydrocarbons (e.g., ethylene), volatile acids and bases, refractory compounds, and volatile organic compounds.

The term "ion exchange membrane" as used herein is a broad term, and is to be given its ordinary and customary meaning to a person of ordinary skill in the art (and is not to be limited to a special or customized meaning), and refers without limitation to a membrane comprising chemical groups capable of combining with ions or exchanging with ions between the membrane and an external substance. Such chemical groups include, but are not limited to, sulfonic acid, carboxylic acid, phosphoric acid, phosphinic acid, sulfamides, sulfonyl imides, arsenic groups, selenic groups, phenol groups, and salts thereof.

Embodiments of the methods, systems, and devices provided herein, in which a carrier gas can be used to deliver low volatility process gases, are shown by reference to FIGS. 1-10.

FIG. 1 shows a process flow diagram illustrating certain embodiments of the methods, systems, and devices of the present invention. As shown in FIG. 1, a carrier gas preloaded with a component A can be introduced into a device or system. The carrier gas can be preloaded with a component A (e.g., water vapor) utilizing a humidifier, chemical vaporizer, or other like device. The carrier gas preloaded with A can then flow through a membrane contactor containing component A and a component B (e.g., $H_2O_2$).

Carrier gas discharged from the membrane contactor can contain component A and component B, which can be provided as a process gas. Optionally, carrier gas containing component A and component B discharged from the membrane contactor can be supplied to a separator (e.g., drier) configured to remove at least a portion of component A. Carrier gas containing component B and a reduced amount of A can then be provided as process gas.

Figure 2A:
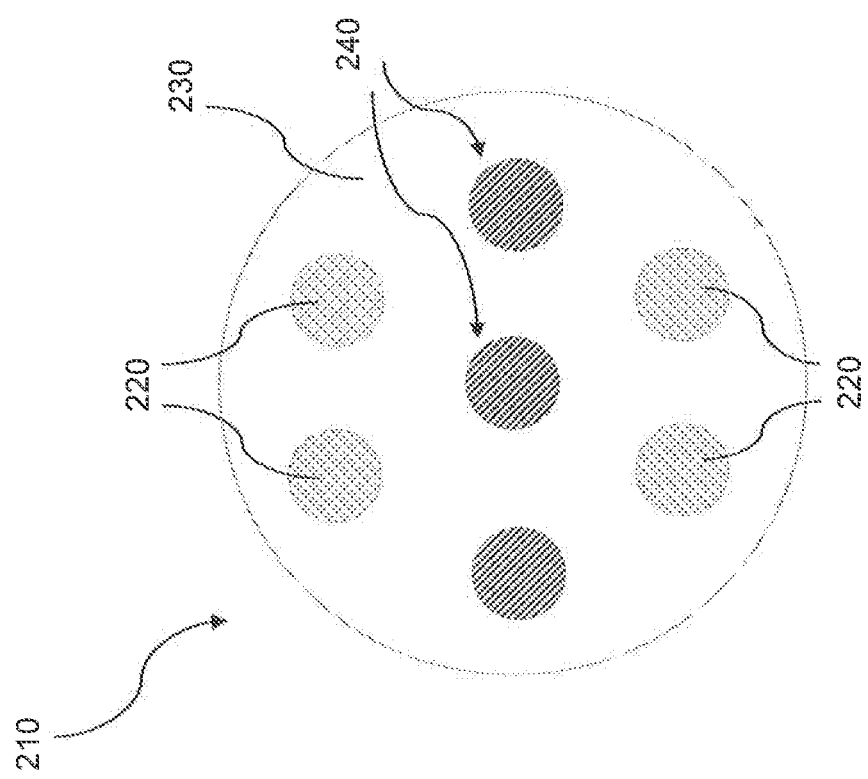
FIG. 2A is a diagram illustrating a part of a membrane assembly useful in certain embodiments of the present invention.

FIGS. 2A and 2B depict different views of one embodiment of a membrane contactor assembly 200 (e.g., a hydrogen peroxide delivery assembly) and a membrane assembly 210 that forms part of a membrane contactor assembly that can be used as provided herein. FIG. 2A shows membrane assembly 210 comprising a plurality membranes 220, for example, 5R NAFION® membrane, which can be configured as lumens. As depicted in FIG. 2A, membranes 220 configured into lumens are inserted into a collector plate 230 through a plurality of holes within collector plate 230. Membrane assembly 210 also comprises a plurality of polytetrafluoroethylenene (PTFE) rods 240 inserted into collector plate 230. As shown in FIG. 2B, as part of membrane contactor assembly 200, membrane assembly 210 comprises membrane lumens 220 spanning collector plates 230. Membrane contactor assembly 200 further comprises endcaps 250 at each end of membrane assembly 210. Endcaps 250 further include branches 260, which can be fitted with tubing to provide access to the interior of membrane contactor assembly 200, e.g., to fill, empty, clean, or refill the membrane contactor assembly.

Figure 3:
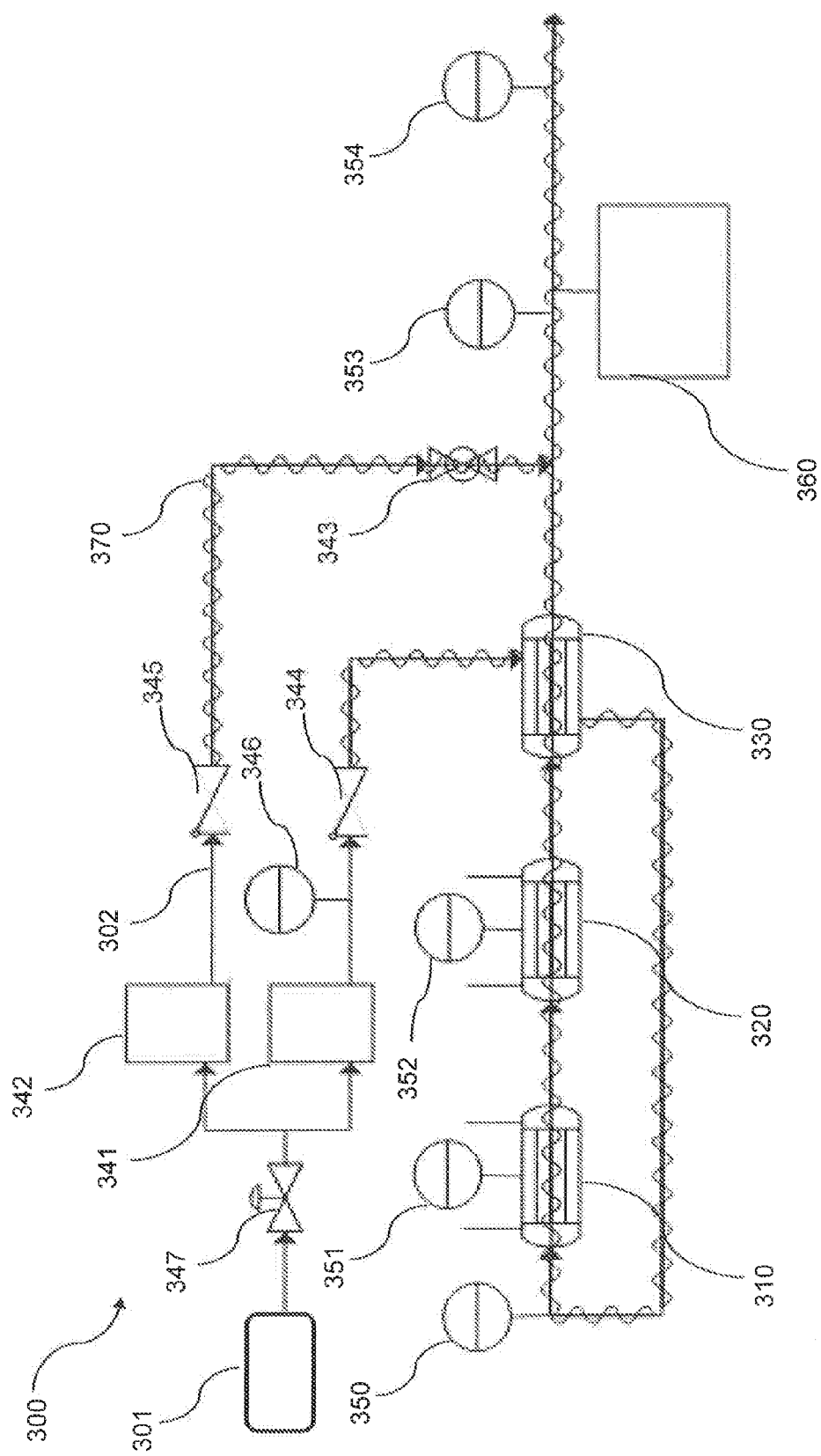
FIG. 3 is a PM of a delivery system according to certain embodiments of the present invention.

An embodiment according to an aspect of the methods, systems, and devices provided herein is described below by reference to FIG. 3. A delivery device 300 can comprise a humidifier 310, a membrane contactor 320, and a drier 330, as shown in FIG. 3. A carrier gas 301 (e.g., nitrogen) can flow through a head space in membrane contactor 320. A mass flow controller (MFC) 341 can be used to control the flow rate of nitrogen carrier gas 301, which can typically be set to 1 slm. A mass flow controller (MFC) 342 can control a dilution gas 302 (e.g., nitrogen) flow rate. A valve 343 can isolate the dilution line when it is not desired. Check valves 344, 345 can be placed downstream of both MFC 341 and MFC 342 to protect them, e.g., from exposure to process gases (e.g., $H_2O$ and $H_2O_2$). A pressure gauge 346 can be placed between MFC 341 and check valve 344 to insure that the manifold's pressure does not exceed a maximum pressure, e.g., 5 psig for certain types of an analyzer 360.

The carrier gas pressure can be maintained with a forward pressure regulator 347, typically set to 15 psig. Carrier gas can flow through humidifier 310 and become pre-loaded with water vapor, or other more volatile component of a multi-component solution (i.e., component A as described above by reference to FIG. 1). A thermocouple 350 can measure the temperature of carrier gas before it enters humidifier 310. A thermocouple 351 can measure the temperature of the liquid in humidifier 310. After exiting humidifier 310, the carrier gas can enter membrane contactor assembly 320 where a low volatility component can be added to the carrier gas from a multi-component solution (i.e., component B as described above by reference to FIG. 1), e.g, hydrogen peroxide. A thermocouple 352 can measure the temperature of the multi-component solution in membrane contactor assembly 320. Optionally, carrier gas can flow through dryer 330 after exiting membrane contactor assembly 320 to remove $H_2O$, or other more volatile component, from the gas stream. When present, dryer 330 can be configured to raise the relative concentration of the low volatility component (i.e., component B) by lowering the relative concentration of the more volatile component (i.e., component A). A thermocouple 353 can measure the carrier gas temperature before optionally entering analyzer 360. After being analyzed, the remaining gas can be sent to a humidity transmitter 354 to measure the relative humidity (RH) and temperature before venting it.

Heater tape 370 can be placed on certain sections of delivery device 300 as shown in FIG. 3. Delivery device 300 can be controlled in two separate zones, the membrane assemblies and the remaining tubing using a Watlow controller. The entire device can be setup inside of a fume hood.

Figure 4A:
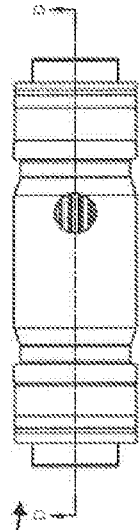
FIG. 4A is a front view of a membrane contactor assembly useful in certain embodiments of the present invention, such as an HPDA.
Figure 4B:
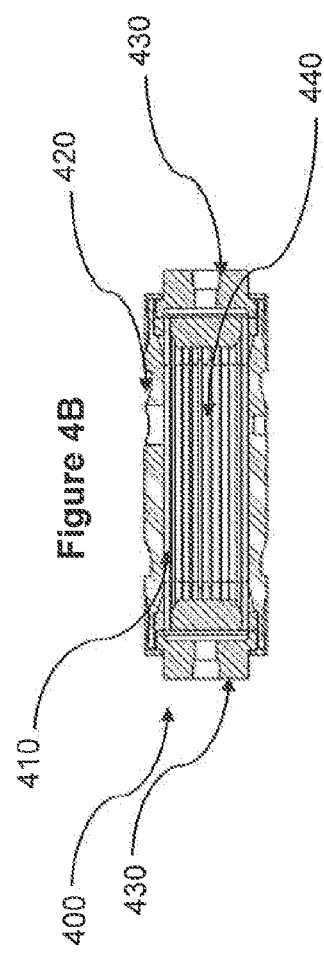
FIG. 4B is a cross-sectional view of a membrane contactor assembly useful in certain embodiments of the present invention, such as an HPDA.
Figure 4C:
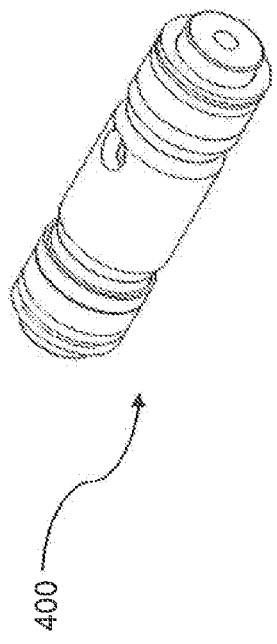
FIG. 4C is a front perspective view of a membrane contactor assembly useful in certain embodiments of the present invention, such as an HPDA.

FIGS. 4A, 4B, and 4C show a membrane contactor assembly 400, according to certain embodiments. Membrane contactor assembly 400 comprises a membrane assembly 410 within a shell housing 420 and end caps 430 configured to couple to shell housing 420. Membrane assembly 410 comprises a plurality of membrane lumens 440. The membrane lumens can be constructed from a perfluorinated sulfonic acid membrane, for example, NAFION® membrane.

A membrane contactor assembly 400 can be configured to operate as a hydrogen peroxide delivery assembly (HPDA). An HPDA can provide a container for a hydrogen peroxide containing solution with a head space separated from the hydrogen peroxide containing solution by a membrane, e.g., a substantially gas-impermeable membrane.

Figure 5:
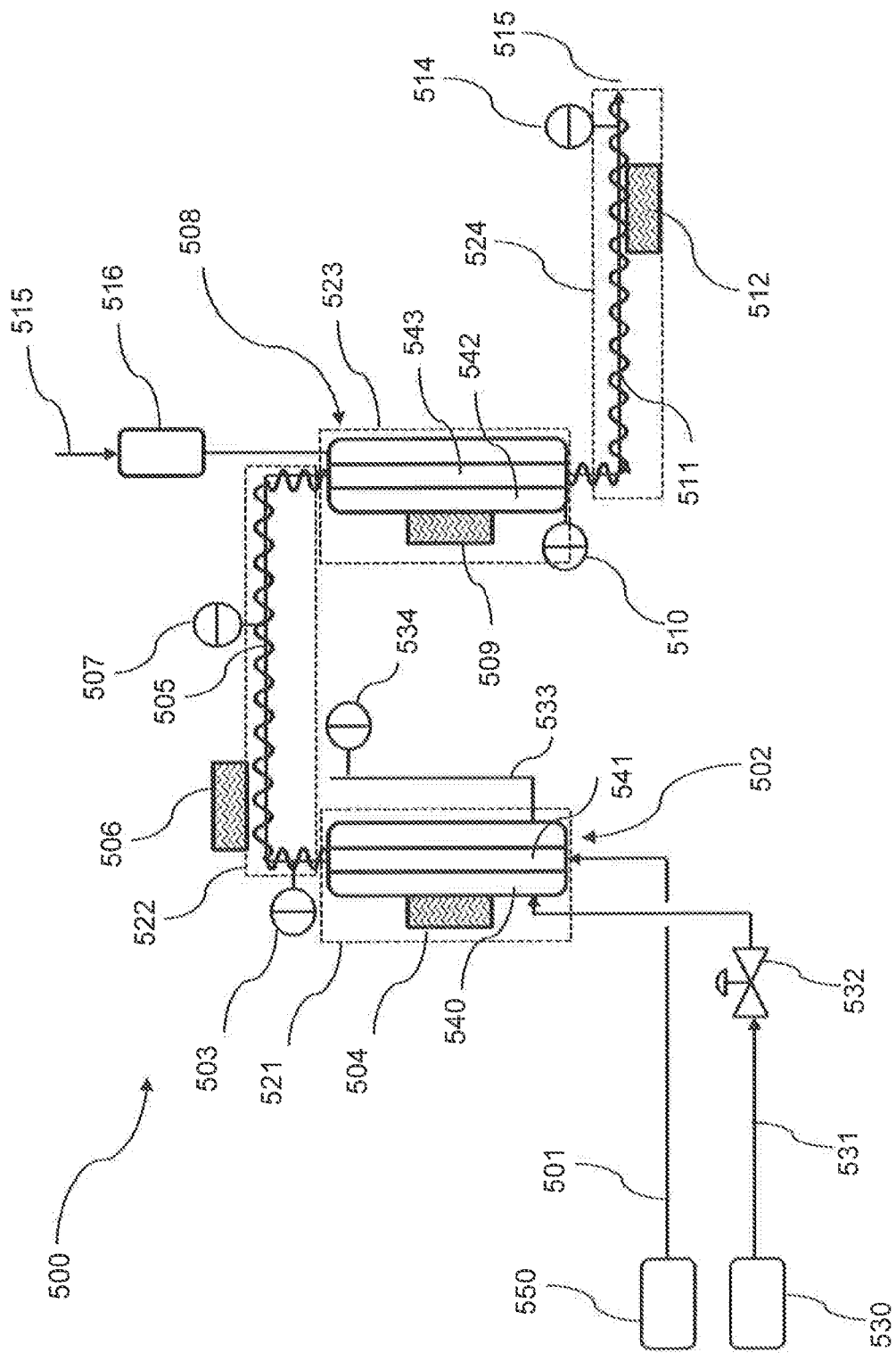
FIG. 5 is a P&ID of a delivery system according to certain embodiments of the present invention.

FIG. 5 shows a P&ID for a delivery system 500 for delivering a low volatility component, e.g., hydrogen peroxide, of a multi-component liquid solution, e.g., an aqueous hydrogen peroxide solution. When configured as a hydrogen peroxide delivery system (HPDS), delivery system 500 can comprise a humidifier 502 in fluid communication with an HPDA 508, e.g., a membrane. In such configuration, delivery system 500 can be configured to receive a carrier gas 550 into humidifier 502 through a gas tubing 501. Carrier gas 550 can flow into a plurality of membranes 541 within humidifier 502.

In addition, humidifier 502 can be configured to receive a water source 530 (e.g., DI water) through a water tubing 531 into water/vapor chamber 540 within humidifier 502. Humidifier 502 can be configured to increase the moisture content of carrier gas 550 flowing through membranes 541. The moisture concentration of the pre-loaded/humidified carrier gas exiting humidifier 502 can be controlled by a heater 504 and a dewpoint probe 503. The moisture concentration of the pre-loaded/humidified carrier gas can be increased or decreased to a setpoint by increasing or decreasing the temperature setpoint of heater 504.

Pre-loaded/humidified Carrier gas can exit humidifier 502 into a gas tube 505. The temperature of the carrier gas can be maintained above the dew point by heating gas tube 505 with heater 506, and the temperature can be measured and controlled with thermocouple 507. The temperature setpoint of heater 506 can be greater than the temperature setpoint of heater 504 in order to limit condensation of water vapor from the pre-loaded/humidified carrier gas.

Pre-loaded/humidified carrier gas can then flow into membrane contactor assembly 508, which can be an HPDA. Membrane contactor assembly 508 can comprise a plurality of membrane lumens 543 and a multi-component solution 542 (e.g., aqueous hydrogen peroxide solution) contained within the shell of membrane contactor assembly 508. Pre-loaded/humidified carrier gas can flow into membrane lumens 543 where multi-component solution 542 is volatized through membrane lumens 543. The concentration of vapor from the multi-component solution entering the pre-loaded/humidified carrier gas can be controlled through thermal regulation. The temperature of the multi-component solution can be controlled with a heater 509, and the temperature of the multi-component solution can be measured with thermocouple 510. The concentration of components of the multi-component solution in the vapor phase can be increased or decreased to a setpoint by increasing or decreasing the setpoint of heater 509.

The carrier gas exiting membrane contactor assembly 508 through gas tube 511 contains both components of the multi-component solution in the vapor phase. The temperature of that carrier gas can be controlled using a heater 512 and a thermocouple 514. Heater 512 can wrap around gas tube 511. That carrier gas, which contains the desired low volatility component can be delivered to a process throughout outlet 515.

The water level in humidifier 502 can be maintained through automatic filling. As the water in humidifier 502 is transferred to vapor into carrier gas 550 the water level can drop. When the level drops below a set level sensed by fill sensor 534 located on a water level leg 533, a valve 532 can open to allow water to flow into humidifier 502. The water level can rise in the humidifier 502 up to a set level sensed by fill sensor 534. When the water level reaches the set level of fill sensor 534, valve 532 can close.

The multi-component solution 542 contained in membrane contactor assembly 508 can be filled and replenished through fill tube 515, which fills membrane contactor assembly 508 and then a reservoir 516. This can be accomplished automatically in a manner similar to humidifier 502. Reservoir 516 can serve the purpose of maintaining level of multi-component solution 542 in membrane contactor 508 for longer periods of time.

Delivery system 500 (e.g., an HPDS) can be separated into four temperature controlled zones, a first zone 521, a second zone 522, a third zone 523, and a fourth zone 524. Carrier gas can flow through delivery system 500 and the corresponding temperature zones starting in first zone 521 and then flowing into second zone 522, third zone 533, and ending in fourth zone 534 before being discharged. First zone 521 can have the lowest temperature, second zone 522 can have setpoint greater than first zone 521, third zone 523 can have a setpoint great than second zone 522, and fourth zone 524 can have the highest temperature setpoint in order to limit the possibility of condensation of vapor out of the carrier gas.

Figure 6:
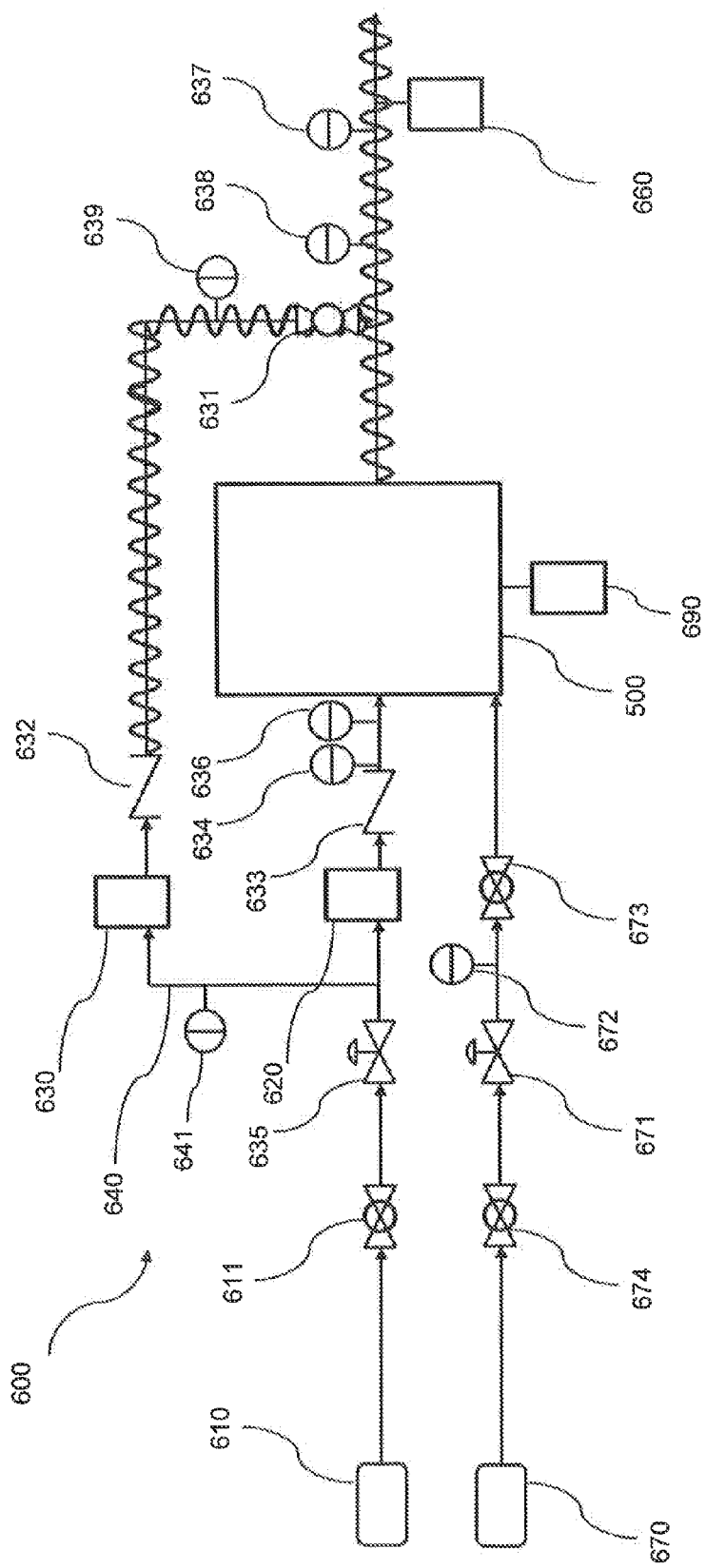
FIG. 6 is a P&ID of a delivery system according to certain embodiments of the present invention.

FIG. 6 shows a P&ID of delivery and monitoring system 600 that can be used to deliver vapor from a low volatility component, e.g., hydrogen peroxide, of a multicomponent solution, according to methods, systems, and devices provided herein, Delivery and monitoring system 600 can be configured to connect a delivery system 500 (e.g., an HPDS) as described above.

Delivery system 600 can be configured to receive a carrier gas 610 (e.g., nitrogen gas) through a mass flow controller (MFC) 620. MFC 620 can be used to control the flow rate of carrier gas 610 into delivery system 500.

MFC 630 can be configured to control the flow rate of a carrier dilution gas 640 that can be configured to bypass delivery system 500. A valve 631 can be used to isolate the dilution line when desired. A pair of check valves 632, 633 can be placed downstream of MFC 620 and MFC 630 to protect them, e.g., from possible exposure to process gases (e.g., $H_2O$ or $H_2O_2$). A pressure gauge 634 can be placed between MFC 620.

The pressure of carrier gas 610 pressure can be maintained with a forward pressure regulator 635. A thermocouple 636 can measure the temperature of carrier gas 610 before it enters delivery system 500. Within delivery system 500, as described above, the vapor phase of a multi-component solution can be introduced into carrier gas 610. A thermocouple 637 can measure the temperature of carrier gas 610 before passing by analyzer 660. A pressure transmitter 638 can measure the pressure of carrier gas 610 before passing by analyzer 660. A thermocouple 639 can measure the temperature of carrier dilution gas 640. A pressure gauge 641 can measure the pressure of carrier dilution gas 640 before passing through MFC 630. A valve 611 can isolate carrier gas 610 supply.

Manifold 600 can be configured to receive a water supply 670 (e.g., deionized water) into delivery system 500. The pressure of water supply 670 pressure can be maintained with a forward pressure regulator 671. A pressure gauge 672 can measure the pressure of water supply 670 before entering delivery system 500. A valve 673 can isolate water supply 670 from delivery system 500 and a valve 674 can isolate water supply 670 from forward pressure regulator 671.

Manifold 600 can further comprise a concentration analyzer 690 configured to measure the concentration of the multi-component solution within delivery system 500.

Manifold 600 as described above was utilized in the following methods according certain embodiments of the present inventions. The following methods used aqueous hydrogen peroxide solutions having a concentration between about 30% to about 50% (w/w) at a temperature of about 40° C. Delivery system 500 was configured as an HPDS employing an HPDA like membrane contactor assembly 400. The HPDA housing and endcaps were PTFE.

Figure 7:
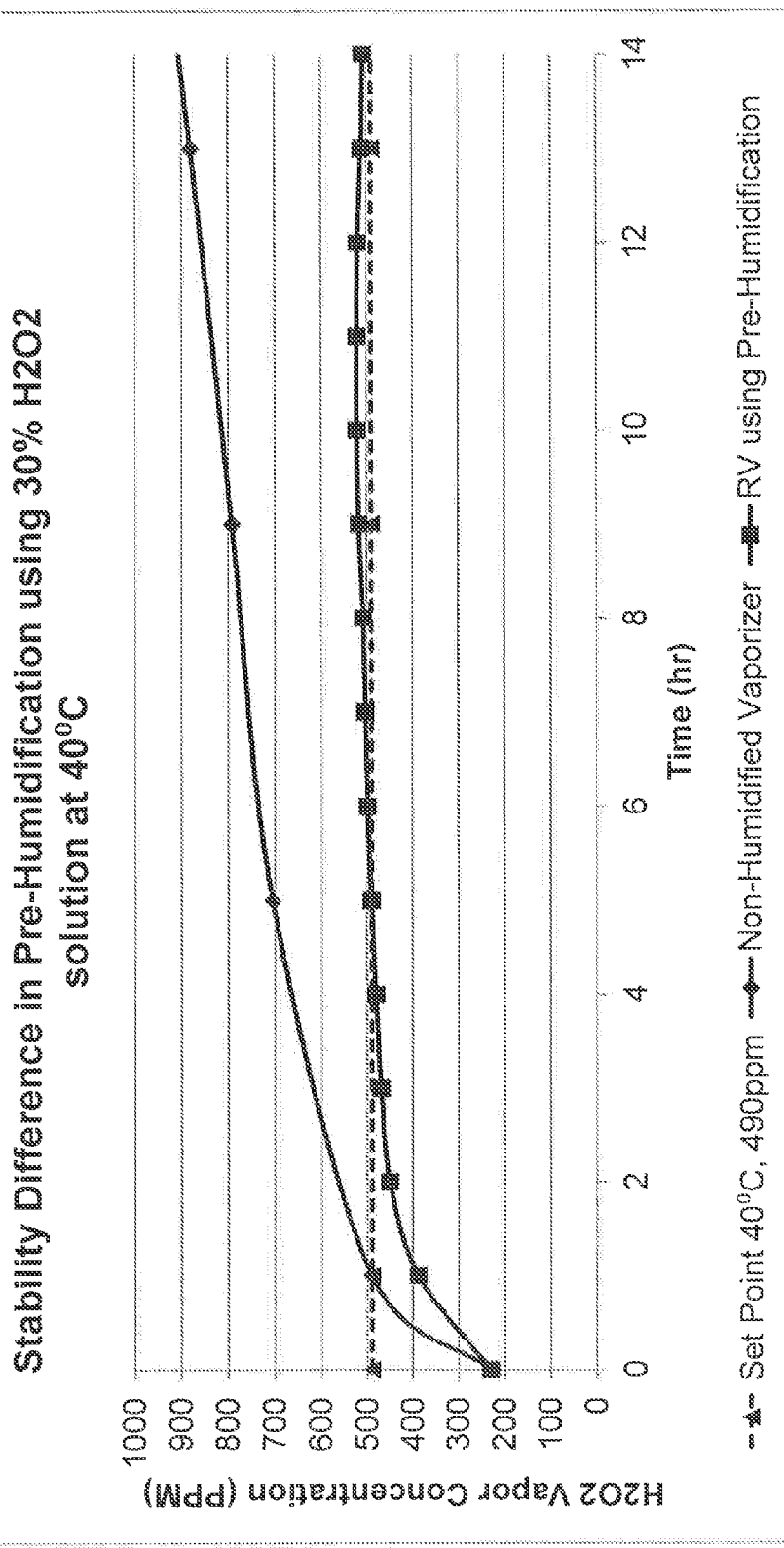
FIG. 7 is a chart depicting the concentration of $H_2O_2$ over time for a 30% $H_2O_2$ aqueous solution at about 40° C. according certain embodiments.

In one method according to certain embodiments of the present invention, HPDS 500 was monitored while operating at at temperature of about 40° C. using a 30% $H_2O_2$ aqueous solution. For comparison, the HPDS was operated with pre-humidified nitrogen carrier gas for a period of time and with dry nitrogen carrier gas for a period of time. According to Raoult's law, the concentration of $H_2O_2$ vapor was expected to be 490 ppm, which was the set point. The data collected from this procedure are depicted in FIG. 7. As shown in FIG. 7, when the pre-humidified nitrogen carrier gas was used with HPDS 500, the $H_2O_2$ concentration increased until it reached approximately the set point after about 3 hours. That $H_2O_2$ concentration was maintained for at least 11 hours, when the procedure was ended. There was no indication that the $H_2O_2$ concentration was not stable or could not be maintained for longer periods of time. By contrast, when dry nitrogen carrier gas was used with HPDS 500, the $H_2O_2$ concentration increased and exceeded the set point within about one hour and then continuously increased throughout the 14-hour duration of the test.

Figure 8:
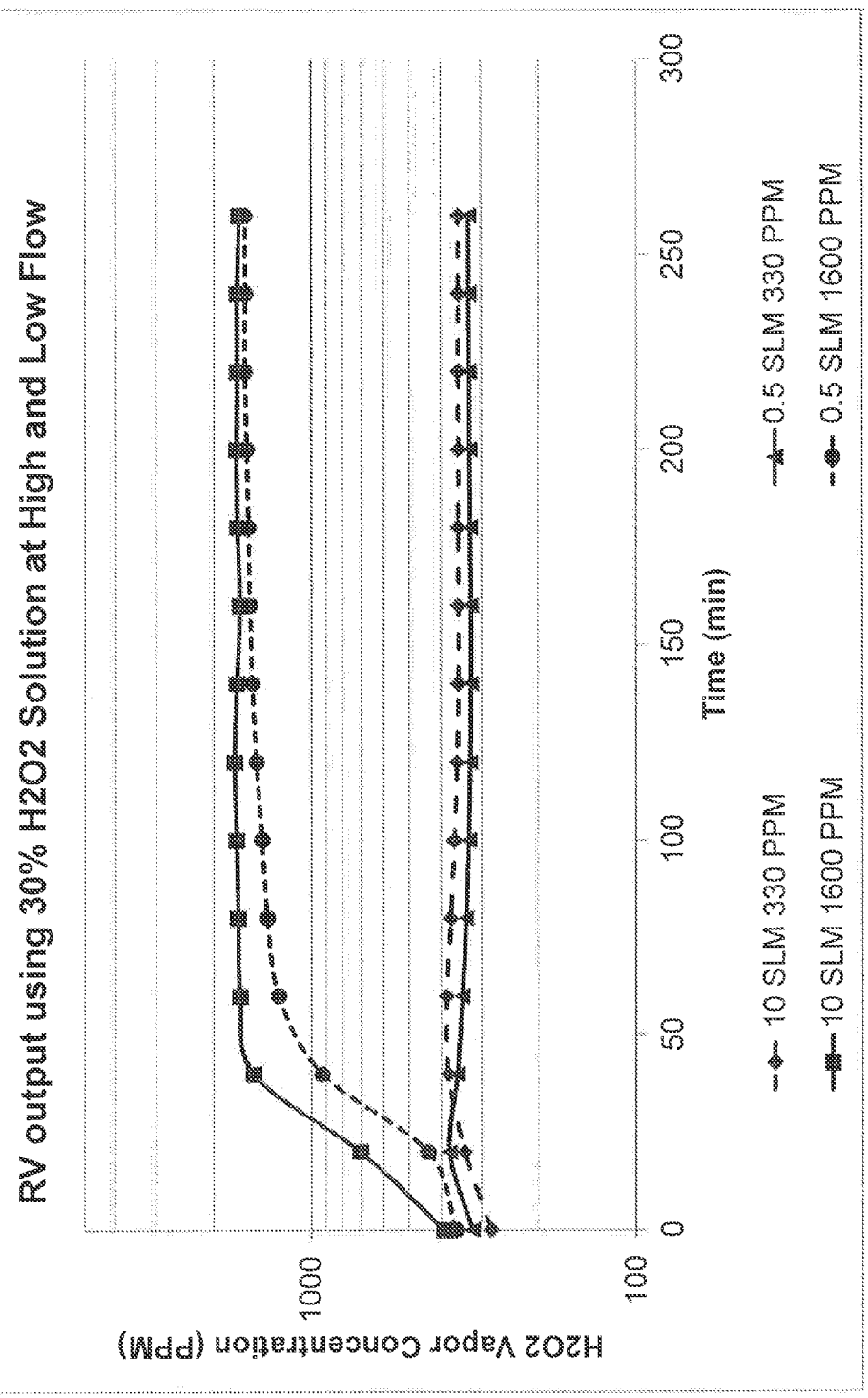
FIG. 8 is a chart depicting the concentration of $H_2O_2$ over time for a 30% $H_2O_2$ aqueous solution at different flow rates.
Figure 9:
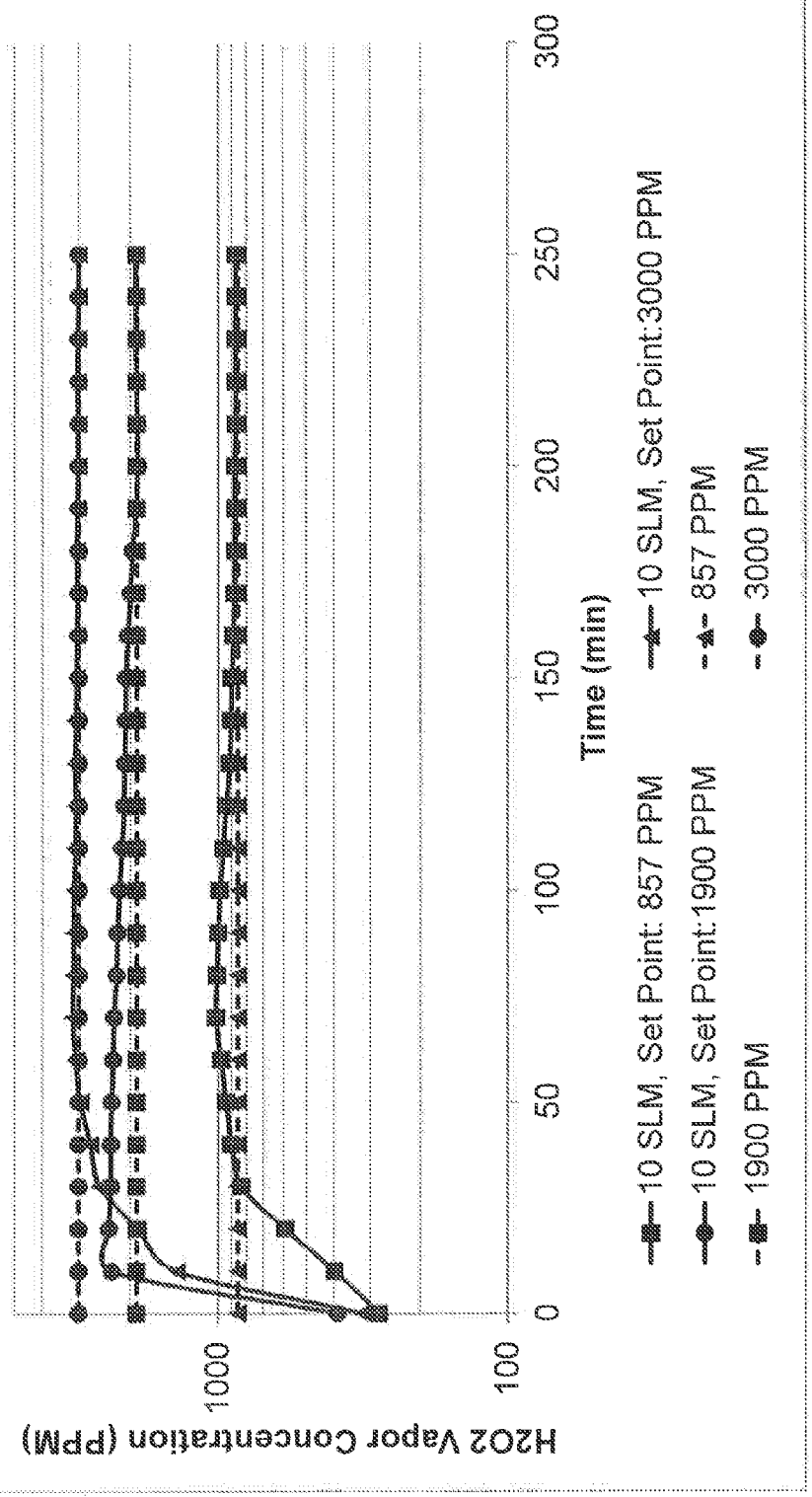
FIG. 9 is a chart depicting the concentration of $H_2O_2$ over time for a 50% $H_2O_2$ solution at different flow rates.

In another method according to certain embodiments of the present invention, HPDS 500 was monitored while operating at different concentration set points and different flow rates using a 30% $H_2O_2$ aqueous solution and pre-humidified nitrogen carrier gas. The HPDS was monitored at concentration set points of 330 ppm and 1600 ppm and flow rates, at both set points, of 0.5 slm and 10 slm. The date collected during this procedure is shown in FIG. 8. As shown in FIG. 8, in all four scenarios the $H_2O_2$ vapor concentration was substantially maintained after the initial startup. The procedure was ended after about 4.5 hours. There was no indication that the $H_2O_2$ concentration was not stable or could not be maintained for longer periods of time In another method according to certain embodiments of the present invention, an HPDS 500 containing a 50% $H_2O_2$ aqueous solution was monitored while pre-humidified nitrogen carrier gas was made to flow through the HPDS at a flow rate of 10 slm. The HPDS was monitored at three different $H_2O_2$ vapor concentration set points: 857 ppm, 1900 ppm, and 3000 ppm. The data collected during this procedure is shown in FIG. 9. As shown in FIG. 9, even at the higher concentration and high flow rate, the HPDS was able to maintain the $H_2O_2$ concentration at each set point.

As discussed above, the amount of the high volatility component (e.g., water) that should be present in the pre-loaded carrier gas may be approximated based on Raoult's Law as $P(preload_a) = x_a(P_a - P_b)$, But this approximation is based on the idealized Raoult's Law and most solutions are non-ideal. Correction factors for the non-ideal behavior of real multi-component solutions can be applied. In certain embodiments, it will be advantageous to pre-determine the amount of the high volatility component in the pre-loaded carrier gas that is required for a certain process and, thus, to calculate the approximate setpoints for the humidifier and membrane contactor assembly.

Figure 10:
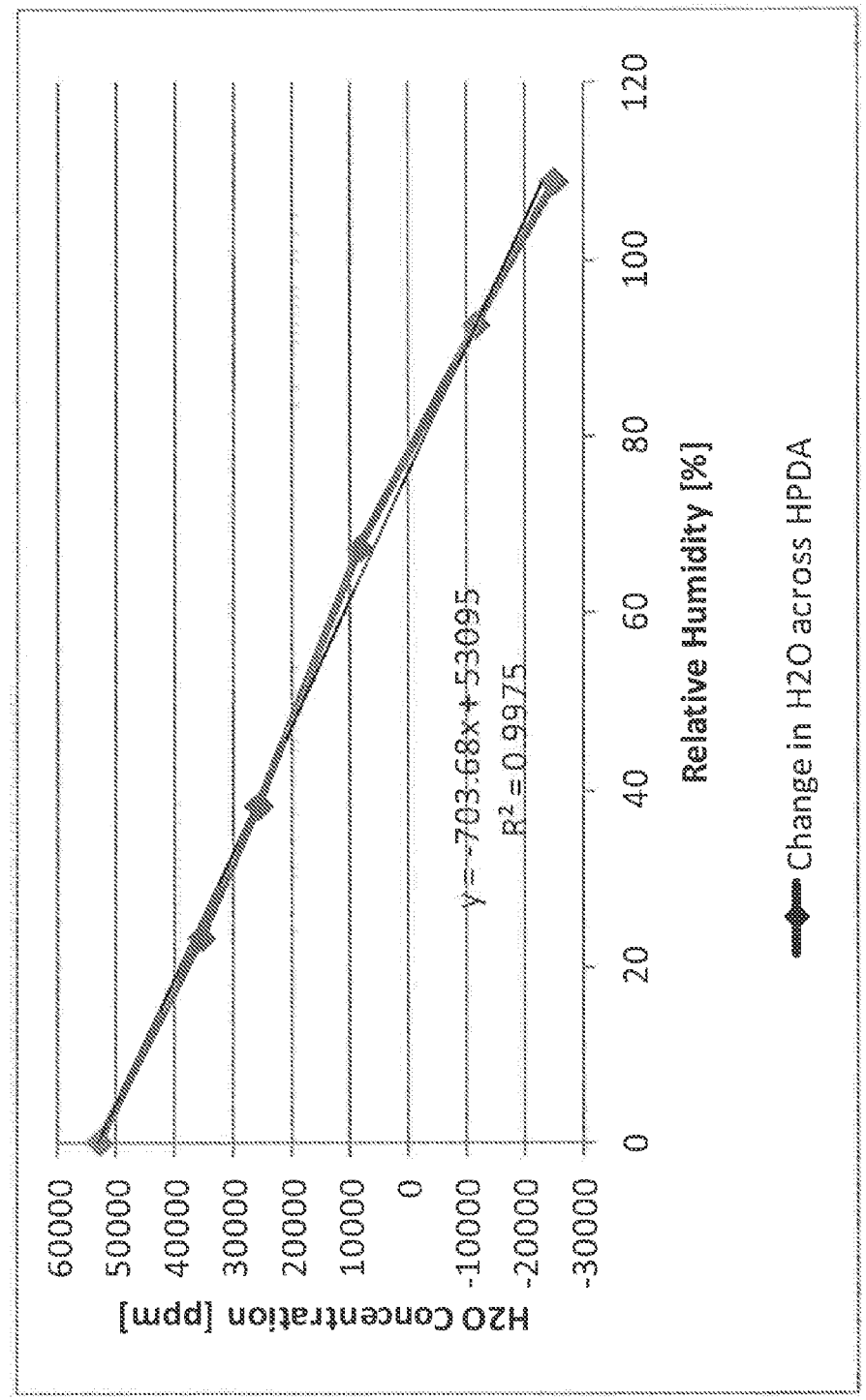
FIG. 10 is a chart plotting the relative humidity measured downstream of the humidifier and upstream of an HPDA shown against the change in $H_2O$ concentration in the gas stream, i.e., the difference in $H_2O$ concentration measured before and after the gas stream passed through the HPDA.

For example, a comparison of the change in water concentration of the pre-loaded/humidified carrier gas after passing through an HPDA to the relative humidity of the pre-loaded/humidified carrier gas is shown by reference to the data in FIG. 10. The data was obtained by adding a relative humidity probe to the delivery system of FIG. 3. Component 330 was removed and the carrier gas was routed directly to humidifier 310. A relative humidity probe was added immediately downstream of humidifier 310. The amount of $H_2O_2$ and water after the membrane contactor assembly 320, which was configured as an HPDA, was then measured. The difference in water and H2O2 before and after HPDA 320 were used to adjust the temperature setpoints for humidifier 310 and HPDA 320. By reference to the analogous items in FIG. 5, changing the temperature setpoints of the humidifier and HPDA can be accomplished by adjusting the temperature setpoints of heaters 504 and 509 through dewpoint probe 503 and thermocouple 510. By using experimentally collected data, the exact temperature setpoints and preload dewpoints needed can be collected and stored for calibration of the specific device.

FIG. 10 plots the flux of water vapor across the HPDA membranes against the relative humidity of the pre-loaded/humidified carrier gas entering the HPDA. As the water concentration of pre-loaded/humidified carrier gas was increased from 0% RH to 110% RH, the flux of water across the HPDA membranes decreases. In this example, between 0% RH and about 75% RH, water was removed from the HPDA, i.e., the flux was positive. Above about 75% RH in this example, water was added to the HPDA from the pre-loaded/humidified carrier gas the membrane into the hydrogen peroxide aqueous solution, thereby diluting the concentration of the solution.

In this way, the methods, systems, and devices according to certain embodiments of the present invention can self-adjust to a predetermined setpoint. If the temperature setpoints of the preload chemical and the multicomponent liquid source are initially incorrect, the concentration of the multi-component liquid source will self-adjust to the temperature-dependent concentration setpoint by either absorbing the high volatility component from the pre-loaded carrier gas to dilute the multi-component solution or adding the high volatility component to carrier gas to concentrate the multi-component solution.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method comprising:
   (a) providing a vapor phase of a multi-component liquid source;
   (b) contacting a pre-loaded carrier gas with the vapor phase, wherein the pre-loaded carrier gas comprises a carrier gas and at least one component of the mufti-component liquid source; and
   (c) delivering a gas stream comprising at least one component of the liquid source to a critical process or application;
   wherein the amount of the component in the carrier gas is sufficient to keep the ratio of components in the multi-component liquid source relatively constant.

2. The method of claim 1, wherein the pre-loaded carrier gas is an inert gas comprising water vapor and the multi-component liquid source comprises water.

3. The method of claim 1, wherein the multi-component liquid source comprises water and another component selected from the group consisting of inorganic acids, organic acids, inorganic bases, organic bases, organic amines, oxidizing agents, reducing agents, hydrogen peroxide, hydrazine, and isopropanol.

4. The method of claim 1, wherein the pre-loaded carrier gas comprises a carrier gas and a component selected from the group consisting of water, alcohols, ketones, ethers, organic acids, inorganic acids, organic solvents, and inorganic solvents.

5. The method of claim 1, further comprising a method for removing at least one component of liquid source from a gas stream, wherein the method is positioned downstream of the vapor phase.

6. The method of claim 5, wherein the component removed from the gas stream is water and the method by which the component is removed uses a membrane contactor drier.

7. The method of claim 1, wherein the mufti-component liquid source is a two-component mixture.

8. The method of claim 7, wherein the two components are water and hydrogen peroxide.

9. The method of claim 7, wherein the two components are water and hydrazine.

10. The method of claim 1, wherein at least one of the components of the liquid source is a reactive process gas.

11. The method of claim 1, wherein the carrier gas comprises nitrogen, argon, hydrogen, oxygen, $CO_2$, clean dry air, helium, or other gases that are stable at room temperature and atmospheric pressure.

12. The method of claim 1, wherein the vapor phase and the liquid source are separated by a substantially gas-impermeable membrane.

13. The method of claim 12, wherein the substantially gas-impermeable membrane comprises a fluorinated ion-exchange membrane.

14. The method of claim 1, further comprising changing the concentration of at least one component of the vapor phase by changing at least one of the following parameters: (a) the temperature of the liquid source, (b) the pressure of the liquid source, (c) the concentration of the liquid source, (d) the temperature of the carrier gas, (e) the pressure of the carrier gas or vacuum, (f) the surface area of the membrane, and (g) the carrier gas flow rate.

15. The method of claim 1, wherein the concentration of the liquid source adjusts based on the concentration of pre-loaded carrier gas.

16. The method of claim 15, wherein the adjustment includes either (a) net absorption of a component of the pre-loaded carrier gas into the liquid source or (b) net removal of a component of the liquid source into the pre-loaded carrier gas.

17. A chemical delivery system comprising:
(a) a multi-component liquid source having a vapor phase;
(b) a pre-loaded carrier gas source that is in fluid contact with the vapor phase, wherein the pre-loaded carrier gas comprises a carrier gas and at least one component of the liquid source; and
(c) an apparatus for delivering a gas stream comprising at least one component of the liquid source;
wherein the amount of the component in the pre-loaded carrier gas is sufficient to keep the ratio of components in the multi-component liquid source relatively constant.

18. The chemical delivery system of claim 17, further comprising a substantially gas impermeable membrane separating the vapor phase from the liquid source.

19. The chemical delivery system of claim 18, wherein the substantially gas impermeable membrane comprises fluorinated ion-exchange membrane.

20. The chemical delivery system of claim 16, wherein the pre-loaded carrier gas source is a device that introduces at least one component of the liquid source into a carrier gas.

21. The chemical delivery system of claim 20, wherein the pre-loaded carrier gas comprises water and the device that introduces the water into the carrier gas is a membrane contactor humidifier.

22. The chemical delivery system of claim 17, wherein the pre-loaded carrier gas comprises a carrier gas and at least one component selected from the group consisting of water, alcohols, ketones, ethers, organic acids, inorganic acids, organic solvents, and inorganic solvents.

23. The chemical delivery system of claim 17, further comprising a device for removing at least one component of liquid source from a gas stream, wherein the device is positioned downstream of the vapor phase.

24. The chemical delivery system of claim 23, wherein the component removed from the gas stream is water and the device that removes the component is a membrane contactor drier.

25. The chemical delivery system of claim 17, wherein the pre-loaded carrier gas is an inert gas comprising water vapor and the multi-component liquid solution comprises water.

26. The chemical delivery system of claim 17, wherein the multi-component liquid solution comprises water and another component selected from the group consisting of organic acids, organic bases, inorganic acids, inorganic bases, oxidizing agents, reducing agents, hydrogen peroxide, hydrazine, and isopropanol.

27. The chemical delivery system of claim 17, wherein the multi-component liquid source is a two-component mixture.

28. The chemical delivery system of claim 27, wherein the two components are water and hydrogen peroxide.

29. The chemical delivery system of claim 27, wherein the two components are water and hydrazine.

30. The chemical delivery system of claim 17, wherein at least one of the components of the liquid source is a reactive process gas.

31. The chemical delivery system of claim 17, wherein the carrier gas comprises nitrogen, argon, hydrogen, oxygen, $CO_2$, clean dry air, helium, or other gases that are stable at room temperature and atmospheric pressure.

32. The chemical delivery system of claim 17, wherein the concentration of at least one component of the vapor phase can be changed by changing at least one of the following parameters: (a) the temperature of the liquid source, (b) the pressure of the liquid source, (c) the concentration of the liquid source, (d) the temperature of the carrier gas, (e) the pressure of the carrier gas or vacuum, (f) the surface area of the membrane, and (g) the carrier gas flow rate.

* * * * *